(12) United States Patent
Gerken et al.

(10) Patent No.: US 9,173,331 B2
(45) Date of Patent: Oct. 27, 2015

(54) VARIABLE THICKNESS EMI SHIELD WITH VARIABLE COOLING CHANNEL SIZE

(71) Applicant: LENOVO ENTERPRISE SOLUTIONS (SINGAPORE) PTE. LTD., Singapore (SG)

(72) Inventors: James D. Gerken, Zumbro Falls, MN (US); David B. Johnson, Rochester, MN (US); David G. Lund, Byron, MN (US); Timothy L. McMillan, Rochester, MN (US)

(73) Assignee: LENOVO ENTERPRISE SOLUTIONS (SINGAPORE) PTE. LTD., Singapore (SG)

( * ) Notice: Subject to any disclaimer, the term of this patent is extended or adjusted under 35 U.S.C. 154(b) by 247 days.

(21) Appl. No.: 13/681,641

(22) Filed: Nov. 20, 2012

(65) Prior Publication Data

US 2014/0140001 A1    May 22, 2014

(51) Int. Cl.
*H05K 9/00* (2006.01)
*G06F 1/18* (2006.01)

(52) U.S. Cl.
CPC ........ *H05K 9/00* (2013.01); *G06F 1/182* (2013.01); *H05K 9/0041* (2013.01)

(58) Field of Classification Search
CPC .............................. H05K 9/0041; G06F 1/182
See application file for complete search history.

(56) References Cited

U.S. PATENT DOCUMENTS

| 5,638,259 | A | 6/1997 | McCarthy et al. |
|---|---|---|---|
| 5,698,818 | A | 12/1997 | Brench |
| 5,726,864 | A | 3/1998 | Copeland et al. |
| 5,928,076 | A | 7/1999 | Clements et al. |
| 7,321,489 | B2 | 1/2008 | McAlister |
| 7,371,977 | B1 | 5/2008 | Preonas |
| 7,491,900 | B1 | 2/2009 | Peets et al. |
| 7,515,410 | B1 | 4/2009 | Dingfelder et al. |
| RE42,512 | E | 7/2011 | Lambert et al. |
| 2007/0297160 | A1* | 12/2007 | Cochrane et al. ............. 361/818 |
| 2011/0297435 | A1 | 12/2011 | Liu et al. |
| 2012/0285738 | A1* | 11/2012 | Cochrane et al. ............. 174/382 |

* cited by examiner

*Primary Examiner* — Ramon Barrera
(74) *Attorney, Agent, or Firm* — Patterson & Sheridan, LLP (57) ABSTRACT

An EMI shield for an electronic system enclosure is disclosed. The EMI shield may include an electrically conductive panel with a plurality of air ventilation channels, which has an upstream airflow side and a downstream airflow side. The EMI shield may also include a first air ventilation channel with a first cross-sectional shape having a first cross-sectional area and a first depth. The EMI shield may further include a second air ventilation channel with a second cross-sectional shape, having a cross-sectional area greater than the first cross-sectional area, and a second depth larger than the first depth.

19 Claims, 8 Drawing Sheets

VARIABLE THICKNESS EMI SHIELD WITH VARIABLE COOLING CHANNEL SIZE

TECHNICAL FIELD

The present disclosure relates to electrical and electronic apparatus. In particular, this disclosure relates to apparatus for cooling an electrical or electronic system, and for shielding electromagnetic interference (EMI) emissions generated by the system during operation.

BACKGROUND

In the present competitive electronics marketplace, there are continuing consumer demands for higher frequency electronic components enclosed in smaller packaging. These requirements have lead to increased temperatures within electronic packages, requiring more cooling. Higher frequency electronic components also generate more disruptive electromagnetic interference (EMI) which, if not properly shielded, can interfere with other electronic equipment that make use of transmitted radio frequency (RF) signals.

EMI emissions typically escapes electronic packages through ventilation holes commonly used for cooling purposes. Consequently, electronic manufacturers often face a design trade-off between cooling the package and shielding for EMI. Printed circuit boards used in various types of electronic equipment are typically mounted within a housing structure. During operation of the electronic device, EMI emissions are generated within electronic components, including circuit boards, chips, and other components mounted on the circuit boards. The EMI emissions emanate from these, and must be substantially prevented from escaping outwardly through the housing structure.

It should be noted that EMI emissions generated by electronic components can include electromagnetic energy of wavelengths along various points of the spectrum such as RF interference. As used herein, the term electromagnetic interference (EMI) refers to interfering electromagnetic energy of any wavelength.

SUMMARY

One embodiment is directed to an electronic system enclosure EMI shield that includes an electrically conductive panel with a plurality of air ventilation channels. The electrically conductive panel has an upstream airflow side and a downstream airflow side. A first air ventilation channel with a first cross-sectional shape having a first cross-sectional area and a first depth is formed in the panel. A second air ventilation channel with a second cross-sectional shape, having a cross-sectional area greater than the first cross-sectional area, and a second depth larger than the first depth is also formed in the panel.

Another embodiment is directed to an EMI shield for an electronic system enclosure that includes an electrically conductive panel having a plurality of air ventilation channels. The electrically conductive panel has an upstream airflow side and a downstream airflow side, and a first thickness and a second thickness greater than the first thickness.

A further embodiment includes a method for creating air ventilation channel design data for an EMI shield based on cooling airflow and EMI shielding needs. The method may include determining the proximity of electronic components within an electronic system enclosure to an EMI shield, determining component's cooling airflow needs and determining system enclosure EMI shielding needs for a range of EMI emission frequencies. The method may also include determining the cross-sectional shape and area, depth, quantity, and arrangement of air ventilation channels in the EMI shield to improve component cooling while providing adequate EMI shielding. The method may further include analyzing the above determinations and creating a first air ventilation channel with a first cross-sectional shape, cross-sectional area and a first depth, and a second air ventilation channel with a second cross-sectional area greater than the first cross-sectional area, and a second depth greater than the first depth in the EMI shield, and incorporating the created air ventilation channel data into an EMI shield design data.

Aspects of the various embodiments may allow cooling airflow in an electronic system enclosure to be increased, while EMI emission levels are maintained or reduced.

BRIEF DESCRIPTION OF THE DRAWINGS

The drawings included in the present application are incorporated into, and form part of, the specification. They illustrate embodiments of the present invention and, along with the description, serve to explain the principles of the invention. The drawings are only illustrative of embodiments of the invention and do not limit the invention.

In the drawings and the Detailed Description, like numbers generally refer to like components, parts, steps, and processes.

DETAILED DESCRIPTION

In general, the embodiments describe an air ventilation panel for cooling and EMI shielding that provides accommodation for components adjacent to the panel. An electronic system enclosure according to the invention may provide improved attenuation for EMI emissions from within the enclosed system, while reducing airflow impedance through the enclosure, therefore improving the cooling capabilities of the system.

Effective EMI shielding and attenuation, as well electronic system cooling are becoming increasingly important as electronic devices operate at higher frequencies, and are housed in ever-smaller packages. These two trends create what are often conflicting requirements on electronic packaging design.

Increased power consumption inside of smaller packaging structures has the potential to increase system operating temperatures, and thus require more cooling to keep temperatures low enough to ensure reliable component operation. Increased cooling demands are often met by increasing airflow through the enclosure, which often can translate into less restrictive elements in the airflow path. Airflow openings, grates, and paths are often enlarged as a result.

Unfortunately, this opening up of airflow paths can often adversely affect electromagnetic interference (EMI) shielding, as increasing apertures in sheet-metal shielding structures has the effect of increasing EMI emissions. The ever-increasing operating frequency of electronic components and systems generates EMI that requires smaller area apertures to attenuate, not larger ones, as cooling needs may seem to demand, thus creating an apparent conflict between cooling and EMI attenuation constraints.

It is understood that EMI shielding is adversely affected by increasing either the number or the size of apertures (cooling air channels) for a given EMI emission frequency. It is also understood that EMI shielding is enhanced by increasing the aperture depth. Thus, a deeper aperture (along the axis of the emitted EMI) may be used to compensate for a larger quantity of shielding apertures or larger aperture cross-sectional areas.

A shield can be constructed with appropriately larger quantity and cross-sectional area of shielding apertures, but in many instances, components such as switches or LEDs within the electronic system require close proximity to the system exterior, or components close to the desired perimeter of the system don't allow the EMI/cooling shield to be uniformly deep.

Embodiments of the invention employ air ventilation channels of varying cross-sectional areas, shapes, and depths. Larger cross-sectional areas combined with deeper apertures are used where allowed by components within the system. These apertures can provide robust EMI attenuation, while still allowing sufficient airflow for cooling. Where components are situated sufficiently close to the EMI shield to prohibit the described apertures, shallower and smaller cross-section apertures are used, in order to still allow some airflow, while sufficiently containing EMI emissions. The proposed combination of larger and smaller apertures may satisfy constraints for both cooling and EMI in physically compact, high operating-frequency, thermally challenged enclosures.

Embodiments of the invention include an electrically conductive EMI shield through which cooling air may pass, which may have two distinguishable sides, referred to as the upstream airflow side and downstream airflow side. Cooling air preferably flows from the upstream airflow side, through the EMI shield, and out to the downstream airflow side. The EMI shield has two or more regions each having different EMI shield thicknesses. Thicker shield regions include air ventilation channels with larger cross-sectional area than channels in thinner regions. Each region contains one or more air ventilation channels that pass air from the upstream airflow side to the downstream airflow side.

Each air ventilation channel within the EMI shield is an unobstructed passageway through the EMI shield, having a substantially constant cross-sectional area and cross-sectional shape. The passageway surface is electrically conductive.

Cross-sectional shapes may include, but are not limited to: circular, rectangular, square, hexagonal, or any polygonal shape. A polygonal shape is defined as a shape consisting of a series of straight lines with connected endpoints, forming a closed area. The area of any particular cross-sectional shape may be calculated by commonly known formulas, for example:

Area of a circle=$\pi r^2$ Where: $\pi$=3.14 and r=the radius of the circle

Area of a rectangle=lw Where: l=length and w=the width of the rectangle

Area of a square=$s^2$ Where: s=length of a side of the square

Figure 5:
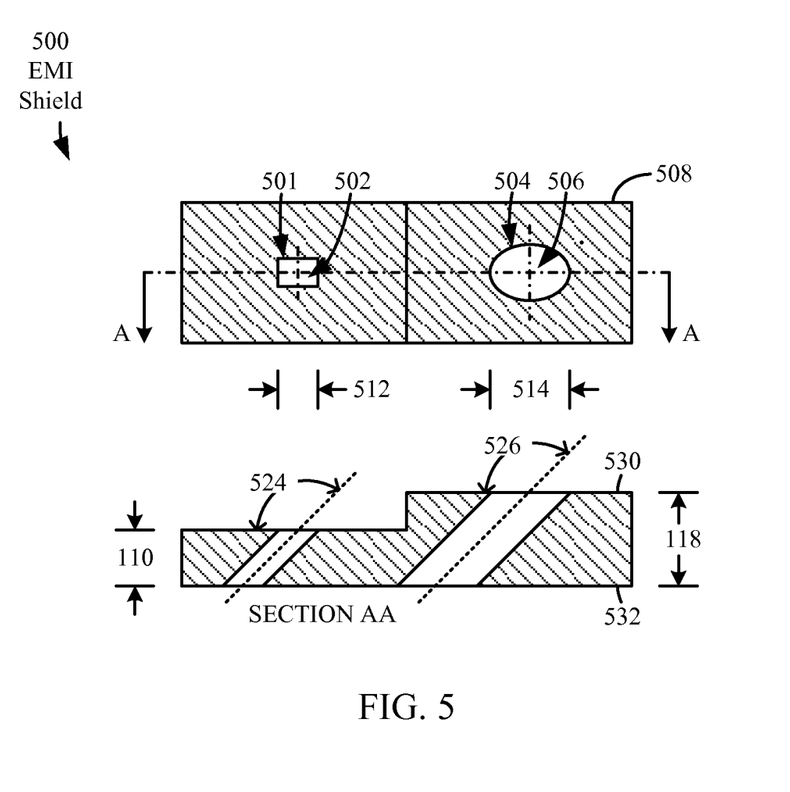
FIG. 5 is a top and front view of an EMI shield having two air ventilation channels formed at an angle not normal to the EMI shield, according to embodiments of the invention.
Figure 6:
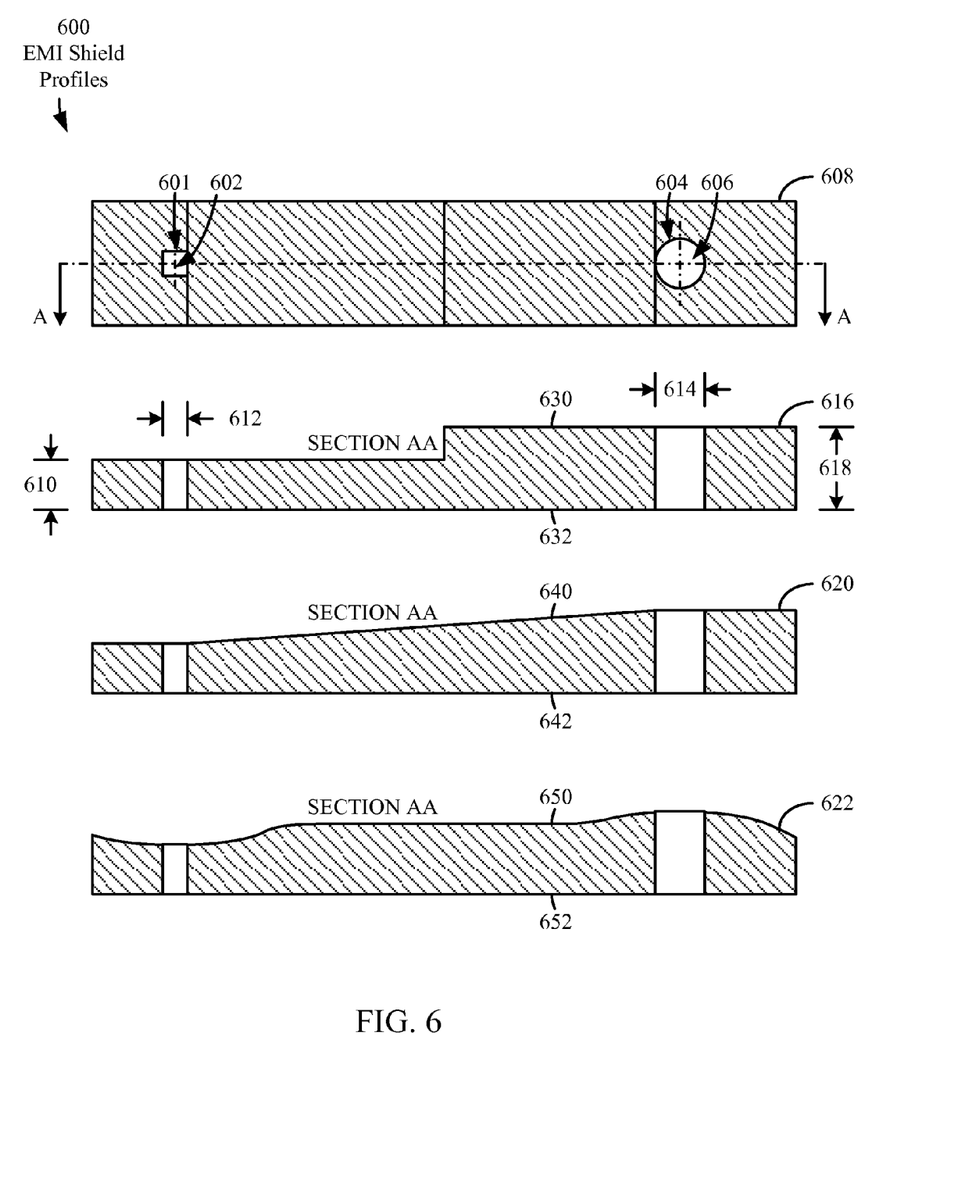
FIG. 6 depicts one top and three front views of EMI shield profiles, having varying contours, according to another embodiment of the invention.
Figure 7:
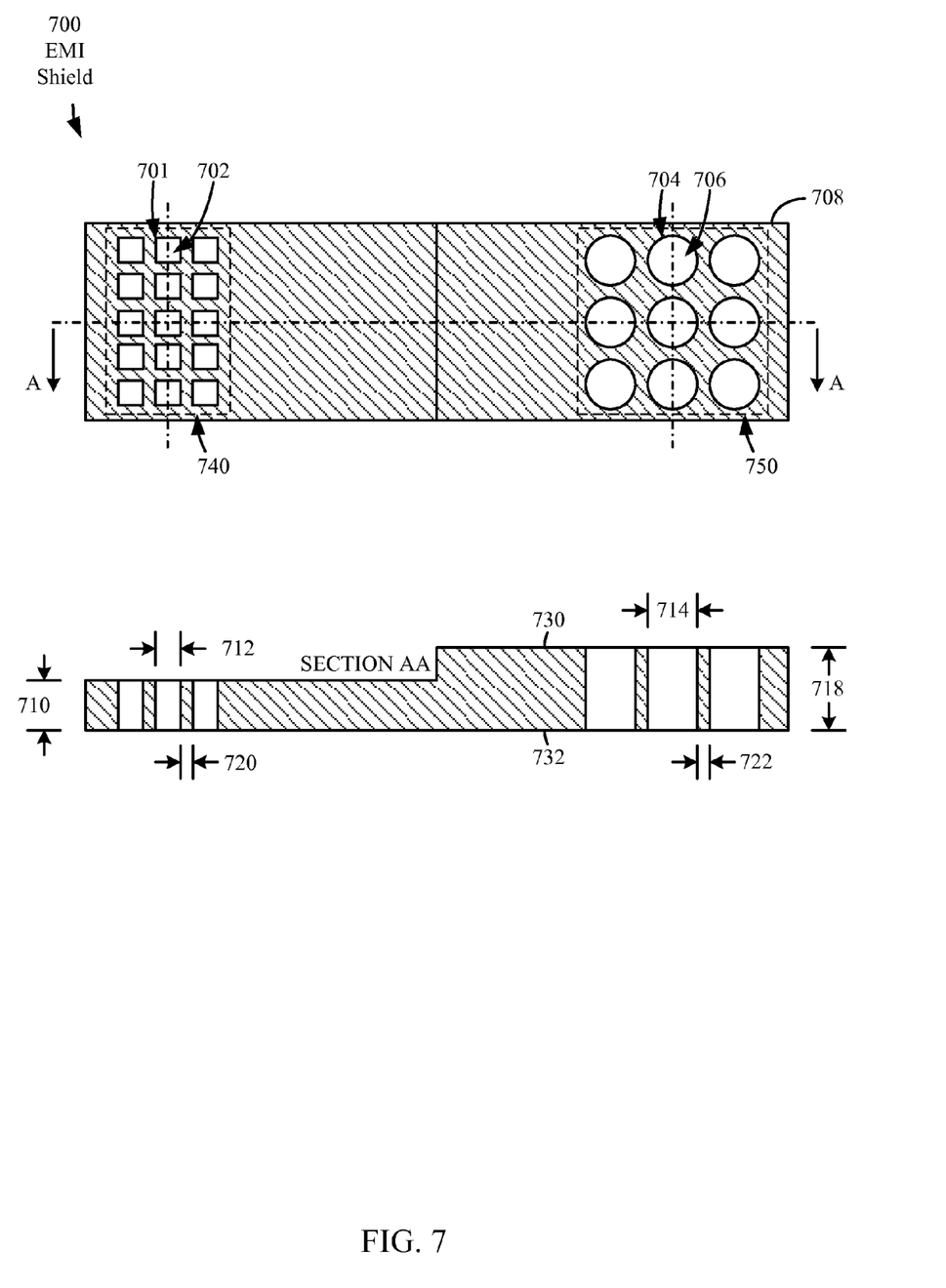
FIG. 7 is a top and front view of two air ventilation channel arrays, each having uniform cross-sectional shapes and channel spacing according to yet another embodiment of the invention.

Area of a regular hexagon=1.5dt Where: d=is the distance between parallel sides, and t is the side length The air ventilation channel cross-sectional shapes illustrated in FIGS. 1, 2, 4, 5, 6 and 7 are only intended to be exemplary; actual shapes used in the practice of the invention may be any of those listed above, or others. The quantity and arrangement of air ventilation channels used in any particular application may vary widely, and may take the form of a regular array or other arrangement of air ventilation channels tailored to meet the cooling and EMI shielding needs of any particular electronic system enclosure. Exemplary air ventilation channel arrays 740, 750 are illustrated in FIG. 7. The actual air ventilation channel cross-sectional shape(s) chosen for any particular section of an EMI shield may depend on cooling airflow and EMI shielding characteristics of the cross-sectional shape, as well as manufacturing complexity and cost factors. Cross-sectional shapes illustrated in FIGS. 1, 2, 4, 5, 6 and 7 are shown to be different (square and circular) in various areas of the EMI shield profile. Other embodiments of the invention may also employ the same shape (e.g.; circular or hexagonal) in different thickness regions of the EMI shield profile.

Each air ventilation channel also has a depth. In some embodiments of the invention, the air ventilation channel depth is defined by an electrically conductive panel thickness that the air ventilation channel passes through. In other embodiments, the air ventilation channel depth is made greater than an electrically conductive panel thickness by an electrically conductive duct adjacent to an electrically conductive panel, the combination that form the EMI shield. In still other embodiments, the air ventilation channel is formed at an angle not normal to the electrically conductive panel, and the resulting channel depth is thus greater than the panel thickness.

It should be noted that the terms "air ventilation channel" and "aperture" will herein be both used to indicate one of two functional uses of an identical physical structure. A void created in, or an electrically conductive duct as part of an EMI shield may be useful as both a means of channeling ventilation air, as well as attenuating EMI emissions. The term "air ventilation channel" will be used in reference to a passageway's airflow properties, whereas the term "aperture" will be used when referring to the passageway's EMI attenuation characteristics The materials used to construct the electrically conductive panel and electrically conductive ducts may include a variety of metals, conductive plastics, plastics with a conductive coating affixed to one or more surfaces, or other electrically conductive materials. Useful metals for fabrication of EMI shields may include aluminum, zinc-plated steel, magnesium, stainless steel and others. Methods of manufacture of metallic EMI shields may include die casting, extrusion, milling, drilling, lamination, or others.

Methods of manufacture of conductive plastic EMI shields may include injection molding, transfer molding, vacuum forming, die cutting, three-dimensional printing, and others.

Figure 1:
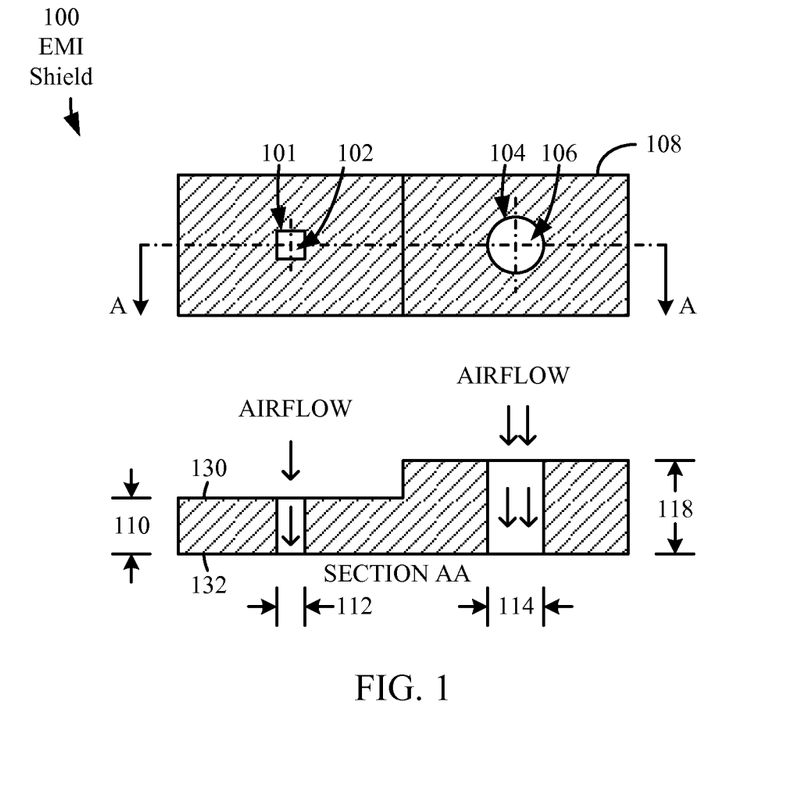
FIG. 1 is a top and front view of an EMI shield having two air ventilation channels according to embodiments of the invention.

FIG. 1 is a top and front view of an EMI shield 100 having two EMI shield thicknesses 110, 118 and two corresponding air ventilation channels 102, 106 (shown), according to embodiments of the invention. Only two air ventilation channels 102, 106 are shown for simplification of the figure and explanation, however, more are contemplated (See FIG. 7). The EMI shield 100 includes an electrically conductive panel 108, which has an upstream airflow side 130 and a downstream airflow side 132. Cooling air is passed through the electrically conductive panel 108 by the air ventilation channels 102, 106 from the upstream airflow side 130 towards the downstream airflow side 132, as illustrated in FIG. 1.

Air ventilation channel 102 has a cross-sectional shape 101, illustrated as a square, having an air ventilation channel width 112. The depth of air ventilation channel 102 is equivalent to the EMI shield thickness 110. Air ventilation channel 106 has a cross-sectional shape 104 illustrated as a circle, with an air ventilation channel diameter 114. The depth of air ventilation channel 106 is equivalent to the EMI shield thickness 118.

The air ventilation channels 102, 106 also act as apertures to attenuate EMI emissions from electronic components and assemblies. The magnitude of EMI attenuation depends on several interrelated factors, as previously discussed.

Figure 2:
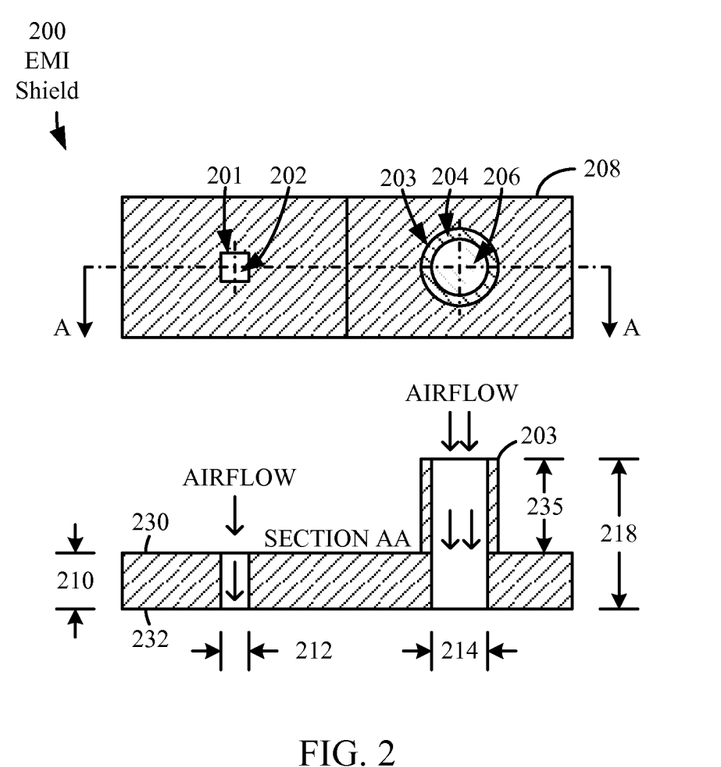
FIG. 2 is a top and front view of an EMI shield having two air ventilation channels, one including an electrically conductive duct, according to embodiments of the invention.

FIG. 2 is a top and front view of an EMI shield 200 having one EMI shield thickness 210, two air ventilation channels 202, 206 (shown), the latter including an electrically conductive duct 204, according to embodiments of the invention. Only two air ventilation channels 202, 206 are shown for simplification of the figure and explanation, however, more are contemplated (See FIG. 7). The EMI shield 200 includes an electrically conductive panel 208, which has an upstream airflow side 230 and a downstream airflow side 232. Cooling air is directed through the electrically conductive panel 208 by the air ventilation channels 202, 206 from the upstream airflow side 230 towards the downstream airflow side 232, as illustrated in FIG. 2.

Air ventilation channel 202 has a cross-sectional shape 201, illustrated as a square, having an air ventilation channel width 212. The depth of air ventilation channel 202 is equivalent to the EMI shield thickness 210. Air ventilation channel 206 has a cross-sectional shape 204 illustrated as a circle, with an air ventilation channel diameter 214. The air ventilation channel diameter 214 is consistent throughout the conductive panel 208 and an adjacent electrically conductive duct 203. The air ventilation channel depth 218 of air ventilation channel 206 is equivalent to the electrically conductive panel thickness 210 plus an electrically conductive duct height 235.

The electrically conductive duct 203 serves to elongate the aperture 206, and provide increased EMI shielding, while adding relatively little additional airflow impedance due to the relatively large area of air ventilation channel 206. The electrically conductive duct 203 may be fabricated from any conductive material described above, and is electrically connected to the conductive panel 208, which is in turn electrically connected to a grounding structure. The sidewall of the electrically conductive duct 203 may be of any designer chosen and manufacturable thickness. Although only one of the air ventilation channels 206 shown in FIG. 2 includes an electrically conductive duct 203, it is contemplated that a plurality of air ventilation channels having a plurality of unique cross-sectional areas, depths, and arrangements may include electrically conductive ducts. The electrically conductive duct 203 and others contemplated may be formed using a pierce and extrude process. The pierce and extrude process allows electrically conductive ducts 203 to be formed in the conductive panel 208, which may be a low-cost, single thickness, sheet metal plate.

The air ventilation channels 202, 206 also act as apertures to attenuate EMI emissions from electronic components and assemblies. The magnitude of EMI attenuation depends on several interrelated factors, as previously discussed.

Figure 3:
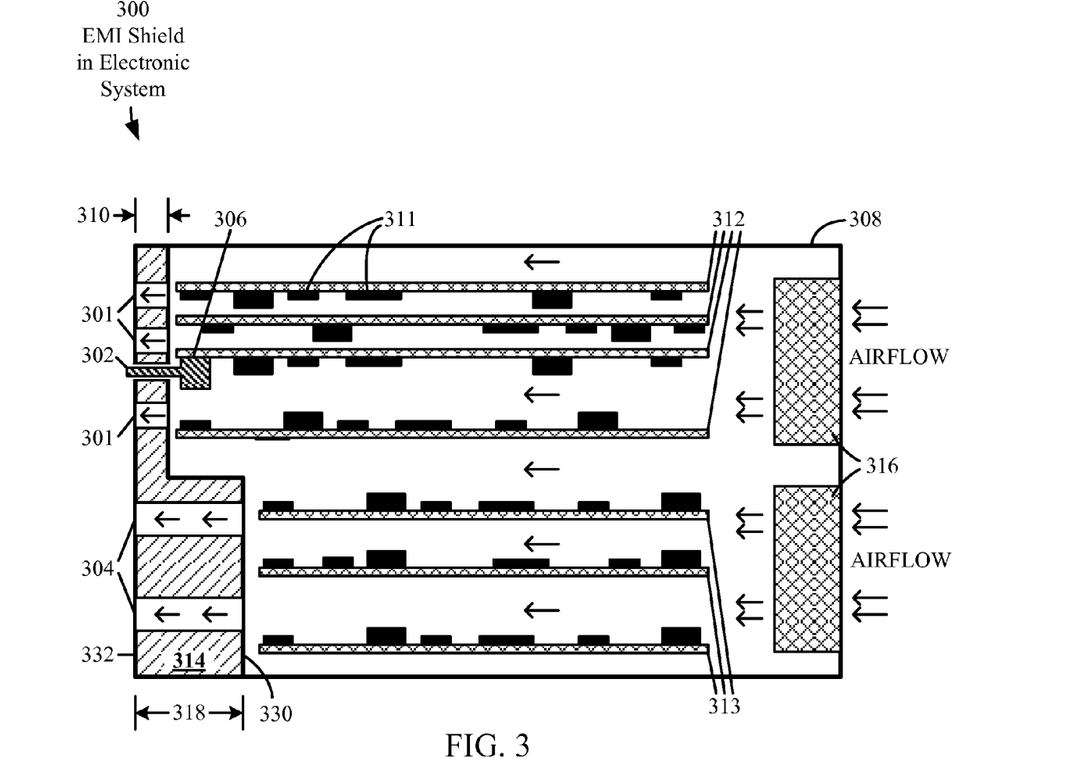
FIG. 3 is a side view of an EMI shield in an electronic system, according to an embodiment of the invention.

FIG. 3 is a side view of an EMI shield in an electronic system 300, having heat and EMI producing electronic components 311, cooling fans 316, and an electronic system enclosure 308 according to embodiments of the invention. The electronic system enclosure 308 is typically a metal or electrically conductive case, with the conductive surface connected to a grounding structure. The electronic components 311 are physically and electrically connected to circuit boards 312, 313 which are in turn physically mounted within the electronic system enclosure 308. Cooling fans 316 are mounted inside the electronic system enclosure 308, and serve to actively draw cooling air into the electronic system enclosure 308, and provide a positive air pressure within the electronic system enclosure 308. The cooling air is propelled by the cooling fans 316 across the circuit boards 312, 313 towards the EMI shield 314, which provides a route for the air to exit the electronic system enclosure 308 through air ventilation channels 301 and 304. The EMI shield 314 has both an upstream airflow side 330, facing the interior of the electronic system enclosure 308, and a downstream airflow side 332, facing the exterior of the electronic system enclosure 308.

The EMI shield 314 has two EMI shield thicknesses 310, 318, and two different sizes of air ventilation channels 301, 304, respectively. The EMI shield 314 is designed to accommodate the varying length of the circuit boards 312, 313, providing adequate clearance between the circuit boards 312, 313 and the EMI shield 314. The size, number, and arrangement of the air ventilation channels 301, 304 as well as the EMI shield thicknesses 310, 318 are designed to meet both the cooling and EMI shielding needs of the electronic system enclosure 308 and electronic components 311 and circuit boards 312, 313.

The EMI shield 314 is also designed to accommodate the protrusion of component 306 through the EMI shield 314. The component 306 may be any component within the electronic system enclosure 308 that requires exposure to the exterior of the electronic system enclosure 308. Examples may include, are not limited to many types of switches, lights or LED indicators, displays, and jacks for external cable connections.

The air ventilation channels 301, 304 also act as apertures to attenuate EMI emissions from electronic components and assemblies. The magnitude of EMI attenuation depends on several interrelated factors, as previously discussed.

Figure 4:
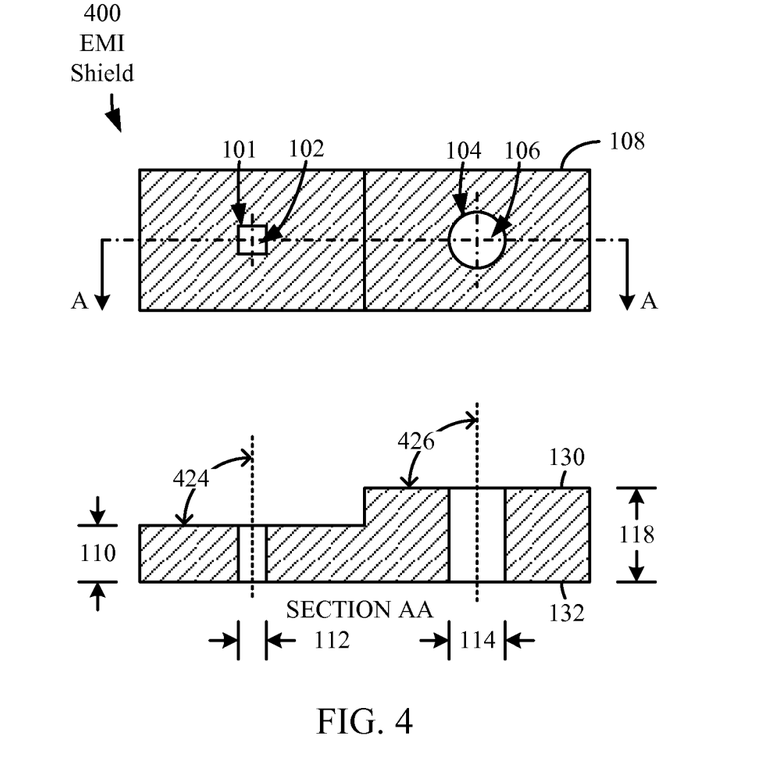
FIG. 4 is a top and front view of an EMI shield having two air ventilation channels formed at an angle normal to the EMI shield, according to embodiments of the invention.

FIG. 4 is a top and front view of an EMI shield 400 having two (shown) air ventilation channels 102, 106 formed at air ventilation channel angles 424, 426 normal to an electrically conductive panel 108, according to embodiments of the invention. Only two air ventilation channels 102, 106 are shown for simplification of the figure and explanation, however, more are contemplated (See FIG. 7). FIG. 4 depicts the identical EMI shield as shown in FIG. 1, with the addition of air ventilation channel angles 424, 426. The air ventilation channel angles 424, 426 are normal to the surface of the electrically conductive panel 108, within typical manufacturing tolerances for the process used to form the air ventilation channels 102, 106.

FIG. 5 is a top and front view of an EMI shield 500 having two (shown) air ventilation channels 502, 506, according to embodiments of the invention. Only two air ventilation channels 502, 506 are shown for simplification of the figure and explanation, however, more are contemplated (See FIG. 7). FIG. 5 depicts an EMI shield similar to that shown in FIG. 1, with the main difference being the two air ventilation channels 502, 506 are formed in a direction different than normal to the electrically conductive panel 508. Air ventilation channel angles 524, 526 are used to illustrate this feature.

The deviation of air ventilation channel angles 524, 526 from normal would be expected to be greater than the angular tolerance for creating air ventilation channels 102, 106 (in FIG. 4). The deviation of air channel angles from normal may be determined by the designer to reduce EMI emissions. Limits for deviation air ventilation channel angles 524, 526 from normal may be influenced by the manufacturing process used to create the air ventilation channels 502, 506.

The air ventilation channels 502, 506 also act as apertures to attenuate EMI emissions from electronic components and assemblies. An aperture 502, 506 having an angle significantly different than normal to the electrically conductive panel 508 may offer the benefit of increased EMI attenuation while not significantly increasing resistance to airflow. Any possible improvement in EMI attenuation characteristics depends on many factors, including but not limited to EMI frequency spectrum, angle of the aperture 502, 506 relative to the radiated emissions, cross-sectional area and depth of the aperture 502, 506. Any angular deviation from normal has the inherent effect of elongating the aperture 502, 506, so some increase in EMI attenuation should be expected, per above discussion.

FIG. 6 is one top and three front views of EMI shield profiles 600, having varying profile contours 616, 620, 622, according to alternative embodiments of the invention. Electrically conductive panel 608 includes two (shown) air ventilation channels 602, 606 and cross-sectional shapes 601, 604, similar to those previously described for FIG. 1. Only two air ventilation channels 602, 606 are shown for simplification of the figure and explanation, however, more are contemplated (See FIG. 7). EMI shield profile 616 depicts a profile with a single vertical step. Similar profiles may be created with multiple vertical steps and thicknesses to accommodate varied component proximities to the electrically conductive panel 608. EMI shield profile 620 depicts a profile with a continuously varying thickness between air ventilation channels. EMI shield profile 622 depicts a profile with concave and convex curvature.

Individual applications of the invention may require a wide variety of profiles in order to meet component placement, EMI attenuation, and system airflow needs. The electrically conductive panel 608 may be fashioned into a wide variety of profiles, including but not limited to those shown.

FIG. 7 is a top and front view of EMI Shield 700 having two EMI shield thicknesses 710, 718 and two (shown) air ventilation channel arrays 740, 750 of corresponding air ventilation channels 702, 706, according to embodiments of the invention. Only two air ventilation channel arrays 740, 750 are shown for simplification of the figure and explanation, however, more are contemplated. The air ventilation channel arrays 740, 750 each include a matrix of air ventilation channels 702, 706, separated by air ventilation channel spacing 720, 722. The air ventilation channels 702, 706 may be regularly or irregularly spaced in any arrangement. The EMI shield 700 is formed from an electrically conductive panel 708, which has an upstream airflow side 730 and a downstream airflow side 732. Cooling air is directed through the electrically conductive panel 708 by the air ventilation channels 702, 706 from the upstream airflow side 730 towards the downstream airflow side 732.

Air ventilation channel 702 has a cross-sectional shape 701, illustrated as a square, having an air ventilation channel width 712. The depth of air ventilation channel 702 is equivalent to the EMI shield thickness 710. Air ventilation channel 706 has a cross-sectional shape 704 illustrated as a circle, with an air ventilation channel diameter 714. The depth of air ventilation channel 706 is equivalent to the EMI shield thickness 718.

The air ventilation channels 702, 706 also act as apertures to attenuate EMI emissions from electronic components and assemblies. The magnitude of EMI attenuation depends on several interrelated factors, as previously discussed.

The profiles illustrated in FIG. 7 vary thickness along one axis. Varying profile thickness along two axes is another way of practicing the invention, though not illustrated herein.

Figure 8:
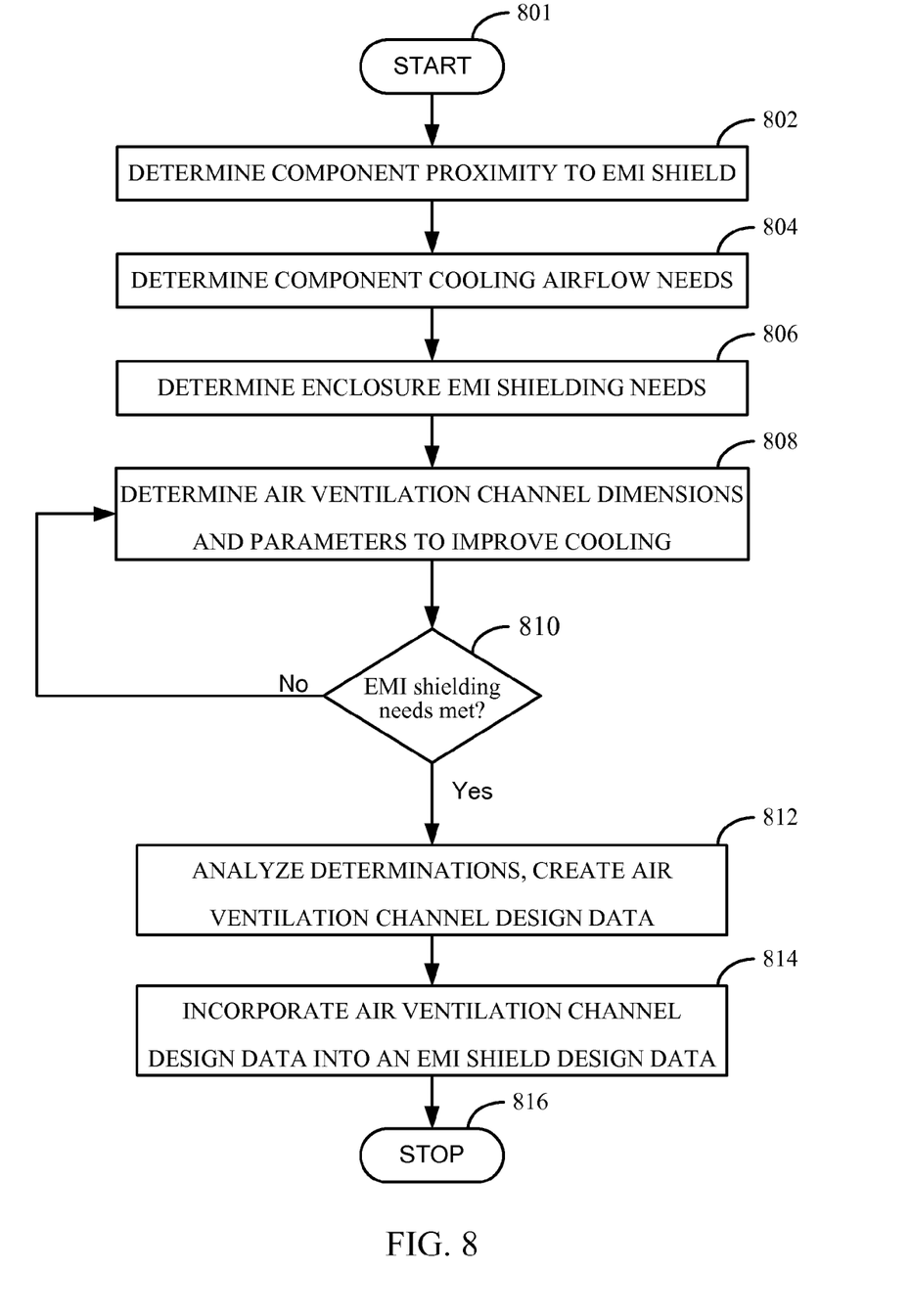
FIG. 8 depicts a flow chart of an exemplary process for creating air ventilation channel design data for an EMI shield, based on cooling and EMI shielding needs, according to an embodiment of the invention.

FIG. 8 depicts a flow chart of an exemplary process for creating air ventilation channel design data for an EMI shield, based on cooling and EMI shielding needs, according to an embodiment of the invention. The process 800 moves from start 701 to determine component proximity to EMI shield 802. At determine component proximity to EMI shield 802, the relative physical location of electronic components 311 (in FIG. 3) and circuit boards 312, 313 (in FIG. 3) are compared to the location of an EMI shield 314 (in FIG. 3). The physical coordinates of components 311, circuit boards 312, 313 and EMI shield 314 may be kept in any 3D mechanical modeling software and may be retrieved or calculated to provide the needed clearances. These clearances are then recorded. The processes 800 moves to determine component cooling airflow needs, where the cooling needs of electronic system enclosure 308 (in FIG. 3) are determined using a thermal flow simulation program. The thermal flow simulation program uses as input power dissipation data for components 306 (in FIG. 3), physical design data from a CAD program and proposed airflow rates from air circulation devices such as cooling fans 316 (in FIG. 3). The thermal flow simulation program produces as outputs expected airflow rates over and worst case operating temperatures for components 306 (in FIG. 3) and circuit boards 312, 313 (in FIG. 3). The component 306 worst case operating temperatures are then compared to component 306 specifications, and airflow and design data is adjusted as needed.

Determining enclosure EMI shielding needs 806 may involve an electromagnetic field simulation program that uses design physical data, emissions profile data for components 306 (in FIG. 3) and circuit boards 312, 313 (in FIG. 3) to calculate EMI emissions outside of the electronic system enclosure 308 (in FIG. 3).

Determine air ventilation channel dimensions and parameters to improve cooling 808 involves adjusting the design of the EMI shield 314 (in FIG. 3) in order to enable adequate airflow through the electronic system enclosure 308 (in FIG. 3), to ensure that components 306 (in FIG. 3) will operate in the recommended temperature ranges. Evaluating whether EMI shielding needs are met 810 may involve comparing EMI levels with FCC or other standards for acceptable levels of emissions.

Iteration through steps 810 and 806 may be necessary to achieve a satisfactory result.

Analyze determinations, create air ventilation channel design data 812 involves examination of the data and simulation results produced thus far, and using the results of that analysis to create the final EMI shield 314 (in FIG. 3) air ventilation channel 301 (in FIG. 3) data. This data may include quantity, cross-sectional shape 101 (in FIG. 1), cross-sectional area, depth, and arrangement data for air ventilation channels 304 (in FIG. 3). The data is created in any 3D mechanical modeling software. The final step incorporate air ventilation channel design data into an EMI shield design data 814 involves integrating the created air ventilation channel 301 (in FIG. 3) design data into a production-level file for prototype and manufacturing needs. This may involve integration with other related design data, and possible post-processing steps. The process 800 may end at block 816.

Although the present invention has been described in terms of specific embodiments, it is anticipated that alterations and modifications thereof may become apparent to those skilled in the art. Therefore, it is intended that the following claims be interpreted as covering all such alterations and modifications as fall within the true spirit and scope of the invention.

What is claimed is:

1. An electromagnetic interference (EMI) shield for an electronic system enclosure, the EMI shield comprising:
   an electrically conductive panel comprising an upstream airflow side, a downstream airflow side, and internal surfaces connecting the upstream and the downstream airflow sides, wherein the internal surfaces forming a plurality of first air ventilation channels in the electrically conductive panel and a plurality of second air ventilation channels in the electrically conductive panel,
   wherein the internal surfaces of adjacent ones of the plurality of first air ventilation channels are connected by a first section of the electrically conductive panel,
   wherein the internal surfaces of adjacent ones of the plurality of second air ventilation channels are connected by a second section of the electrically conductive panel, and
   the first and the second sections respectively have first and second uniform thicknesses, wherein the second uniform thickness is greater than the first uniform thickness.

2. The EMI shield according to claim 1, wherein the plurality of first air ventilation channels and the plurality of second air ventilation channels are adapted to attenuate EMI emissions from the electronic system enclosure.

3. The EMI shield according to claim 2, wherein the plurality of second air ventilation channels are electrically conductive ducts having a substantially constant and unrestricted cross-sectional area, and the second section extends outwards from the downstream airflow side of the electrically conductive panel.

4. The EMI shield according to claim 3, wherein the plurality of first air ventilation channels and the plurality of second air ventilation channels air ventilation channels are formed using a pierce and extrude process and have substantially constant and unrestricted cross-sectional areas.

5. The EMI shield according to claim 2, wherein the first air ventilation channels and the plurality of second air ventilation channels air ventilation channels are voids in the electrically conductive panel, having substantially constant and unrestricted cross-sectional areas.

6. The EMI shield according to claim 1, wherein the first air ventilation channels and the plurality of second air ventilation channels air ventilation channels have a substantially constant and unrestricted circular cross-sectional area.

7. The EMI shield according to claim 1, wherein the first air ventilation channels and the plurality of second air ventilation channels air ventilation channels have a substantially constant and unrestricted polygonal cross-sectional area.

8. The EMI shield of claim 1, wherein each of the plurality of first air ventilation channels includes a first cross-sectional shape having a first cross-sectional area and a first depth,
   each of the plurality of second air ventilation channels includes a second cross-sectional shape having a cross-sectional area greater than the first cross-sectional area, and a second depth greater than the first depth.

9. The EMI shield according to claim 8, wherein the first cross-sectional shape and the second cross-sectional shape are different.

10. The EMI shield of claim 1, wherein:
    the downstream airflow side is disposed in a geometric plane,
    a first portion of electronic components of the electronic system is configured to be disposed closer to the geometric plane than a second portion of the electronic components,
    the first section of the electrically conductive panel is configured to be disposed between the geometric plane and the first portion of the electronic components along a first geometric line normal to the geometric plane, and
    the second section of the electrically conductive panel is configured to be disposed between the geometric plane and the second portion of the electronic components along a second geometric line normal to the geometric plane.

11. The EMI shield of claim 1, wherein the first section of the electrically conductive panel entirely surrounds the plurality of first air ventilation channels and the second section of the electrically conductive panel entirely surrounds the plurality of second air ventilation channels.

12. The EMI shield of claim 1, wherein the first and the second sections of the electrically conductive panel are integral.

13. An electronic system, comprising:
    electronic components;
    at least one cooling fan generating an airflow; and
    an electronic system enclosure disposed around the electronic components, the electronic enclosure includes an electromagnetic interference (EMI) shield, wherein the EMI shield comprises:
       an electrically conductive panel comprising an upstream airflow side, a downstream airflow side, and internal surfaces connecting the upstream and the downstream airflow sides, wherein the internal surfaces forming a plurality of first air ventilation channels in the electrically conductive panel and a plurality of second air ventilation channels in the electrically conductive panel,
       wherein the internal surfaces of adjacent ones of the plurality of first air ventilation channels are connected by a first section of the electrically conductive panel,
       wherein the internal surfaces of adjacent ones of the plurality of second air ventilation channels are connected by a second section of the electrically conductive panel, and
       the first and the second sections respectively have first and second uniform thicknesses, wherein the second uniform thickness is greater than the first uniform thickness.

14. The electronic system of claim 13, wherein the plurality of first air ventilation channels and the plurality of second air ventilation channels are adapted to attenuate EMI emissions from the electronic system enclosure.

15. The electronic system of claim 14, wherein the first uniform thickness and the second uniform thickness provide accommodation for proximity of components to the electrically conductive panel.

16. The electronic system of 15, wherein the first uniform thickness is adapted to allow a component of an electronic system to extend outward from the electronic system enclosure through the EMI shield.

17. The electronic system of claim 13, wherein the plurality of air ventilation channels are oriented to extend away from the downward side of the electrically conductive panel in a direction approximately normal to the electrically conductive panel.

18. The electronic system of claim 13, wherein the plurality of air ventilation channels are oriented to extend away from the downward side of the electrically conductive panel in a direction significantly different than normal to the electrically conductive panel.

19. The electronic system of claim 13, wherein
the downstream airflow side is disposed in a geometric plane,
a first portion of electronic components of the electronic system is disposed closer to the geometric plane than a second portion of the electronic components,
the first section of the electrically conductive panel is disposed between the geometric plane and the first portion of the electronic components along a first geometric line normal to the geometric plane, and
the second section of the electrically conductive panel is disposed between the geometric plane and the second portion of the electronic components along a second geometric line normal to the geometric plane.

\* \* \* \* \*